(12) United States Patent
Kern et al.

(10) Patent No.: US 6,215,366 B1
(45) Date of Patent: Apr. 10, 2001

(54) METALLIC CELL FOR OPTICALLY ACTIVATED ATOMIC FREQUENCY STANDARDS

(75) Inventors: Robert H. Kern, Danvers; Michael J. Delaney, Amesbury; Kristin N. Bonnette, Wenham, all of MA (US)

(73) Assignee: Kernco, Inc., Danvers, MA (US)

(*) Notice: Subject to any disclaimer, the term of this patent is extended or adjusted under 35 U.S.C. 154(b) by 0 days.

(21) Appl. No.: 09/306,670

(22) Filed: May 5, 1999

(51) Int. Cl.[7] ............... H01P 7/06; H01S 1/06; H03L 7/26
(52) U.S. Cl. .................................. 331/94.1; 331/3
(58) Field of Search ............................ 331/3, 94.1

(56) References Cited

U.S. PATENT DOCUMENTS

| | | | |
|---|---|---|---|
| 3,248,666 | * | 4/1966 | Farmer ............................ 331/3 |
| 4,494,085 | * | 1/1985 | Goldberg ........................ 331/3 |
| 4,495,478 | * | 1/1985 | Kwon et al. .................... 331/3 |
| 5,327,105 | * | 7/1994 | Liberman et al. ............. 331/3 |
| 5,656,974 | * | 8/1997 | Thomann et al. . |

* cited by examiner

Primary Examiner—Siegfried H. Grimm
(74) Attorney, Agent, or Firm—Barry R. Blaker

(57) ABSTRACT

The invention disclosed herein is a cell construction for use in optically activated atomic frequency standards. The cell includes a stiff non-magnetic metallic chamber body having an integral cold weldable tubulation through which the atomic source material may be charged and the tubulation pinched off to seal the chamber. Optically transparent windows for introducing light radiation into the chamber and receiving light signals generated therein are sealed to the chamber.

11 Claims, 2 Drawing Sheets

METALLIC CELL FOR OPTICALLY ACTIVATED ATOMIC FREQUENCY STANDARDS

BACKGROUND OF THE INVENTION

The present invention relates broadly to the field of optically activated atomic frequency standards and is more particularly directed to a cell construction therefor.

In optically activated atomic frequency standards of the prior art the atomic source composition, usually composed of a precise mixture of (i) resonance source atoms having a single electron in the outermost shell thereof, such as rubidium and cesium, and (ii) one or more inert buffer gases, is contained in a sealed glass cell. Often, the internal surfaces of the cell are coated with a material which is chemically inert with respect to the source atoms and which acts to mitigate against premature perturbation and/or relaxation of the excited resonance source atoms upon their impact with the walls of the cell. For instance, coating materials such as paraffins, polytetrafluoroethylene (PTFE) and dimethyldichlorosilane have been found to be helpful in this regard. The resonance source atoms are prepared by means of optical activation wherein light radiation of the appropriate wavelength and intensity is introduced into the cell. This can be achieved, for instance, by shining an appropriately filtered spectral light or a laser light beam of appropriate wavelength into the cell. The signal output of the cell can be represented by the light transmitted therethrough and/or by fluorescence emitted by the resonant source atoms contained therein.

Several problems attend the use of glass cells for the aforementioned purpose. For instance, the achievement of qualitatively and quantitatively precise and chemically uncontaminated mixtures of the atomic resonance source atoms and buffer gases within the cell is an essential to the achievement of a long lived properly operating optically activated atomic frequency standard. Such qualitative and quantitative precision is difficult to achieve utilizing a glass cell wherein the ultimate sealing of the cell after filling with the atomic source material is conventionally achieved by a glass melt or fusion tip-off wherein an integral glass inlet tubulation to the cell is sealed at essentially molten glass temperature. Too, even though the heating required to produce the glass tip-off may be relatively localized relative to the overall mass and/or size of the cell, the opportunity exists for sublimation or out-gassing of tramp or contaminant materials from the heated glass and into the resonant source material charge of the cell. In addition, glass cells of the prior art have been found to exhibit permeability to helium; thus, the atomic source material contained in such cells can be ultimately adulterated over time when the atmosphere in which they are operated contains helium. In addition, the internal environment of glass cells in optically activated atomic frequency standards of the prior art, and thus their accuracy and stability of operation, can be adversely affected by barometric pressure change. It is also known in the atomic frequency standard art that precise temperature control of an atomic resonance cell is often required to achieve acceptable results. Thus, in optically activated atomic frequency standards of the prior art it is conventional to provide the cell with various external insulation blankets and temperature controlled heaters in order to maintain constancy of internal cell temperature. Glass cells, due to the relatively low thermal conductivity of glass materials, in general, are somewhat slow to either exhibit an internal temperature change or to conduct externally applied heat therethrough at a sufficient rate as to allow quick adjustment and attainment of constancy of their internal temperatures.

In light of the present invention, the foregoing problems have been, severally or in combination, either fully resolved or at least substantially ameliorated. In addition, the present invention provides a novel cell construction in which additional benefits, some of which will be discussed hereinafter and some of which will be obvious, can be achieved.

SUMMARY OF THE INVENTION

In accordance with the invention, the cell construction hereof broadly comprises a chamber body composed of a stiff, non-magnetic metal, said chamber body having at least one inlet window aperture, at least one outlet window aperture and, integrally attached thereto, a cold weldable metallic pinch-off tubulation through which an atomic resonance source mixture is charged and sealed thereinto. Sealed to each said window aperture of said metallic chamber is a transparent window element. In a preferred embodiment of the invention means are provided by which internal reflection of incident light radiated into said chamber through the window element of said inlet aperture is prevented from reflecting back through said inlet window element. In another preferred embodiment of the invention at least one of said glass window elements is in the nature of a lens by which the light transmitted therethrough is physically modified, such as by collimation.

DESCRIPTION OF THE PREFERRED EMBODIMENTS

Figure 1:
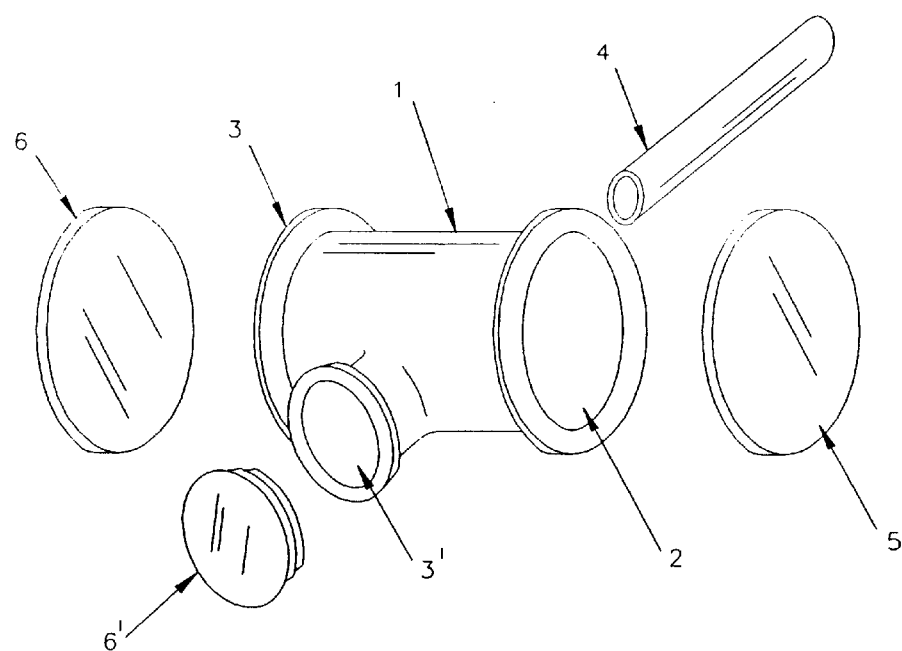
FIG. 1 hereof is a schematic, diagrammatic, exploded perspective view of a cell embodiment in accordance with the invention, said embodiment having a pair of outlet apertures and associated transparent windows disposed such that light output signals of transmitted light and/or fluorescence of the resonant source atoms can be detected and where the window element of the inlet aperture may be in the nature of a collimating lens.
Figure 2:
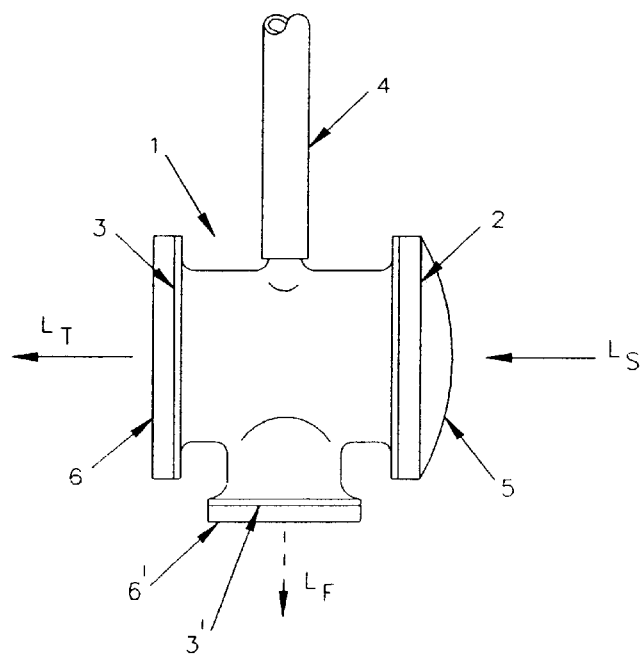
FIG. 2 is a schematic, diagrammatic tip view of the assembled embodiment of FIG. 1.

Referring now to FIGS. 1 and 2, wherein like reference numerals refer to like structures, the cell construction of the invention broadly comprises a stiff, non-magnetic metallic chamber body 1 having at least one inlet window aperture 2, at least one outlet window aperture 3, 3' and integrally attached thereto, a cold weldable metallic pinch-off tubulation 4 through which the atomic source material components are charged into said chamber body. The cold weldable metallic pinch-off tubulation 4 can be formed, for example, of copper or nickel. Sealed to the inlet window aperture 2 is a glass inlet window element 5. Sealed to each of the outlet window apertures 3, 3' is a glass outlet window element 6, 6'. Such sealing of the window elements to the metallic chamber apertures can be achieved by any conventional glass-to-metal sealing technique, such as by suitably metallizing the glass window elements and brazing the metallized elements to the metallic chamber apertures. Upon sealing of the window elements to the metallic chamber body 1, and after cleaning and firing of the assembly, a precise charge of the atomic resonance source material which, as mentioned, may include one or more buffer gas(es), is charged into the chamber body 1 through the tubulation 4 and the tubulation is pinched off by cold welding thereof. Thus, the sealing of the metallic chamber 1 in the cell of the present invention is achieved substantially more simply and easily than by the high temperature tip-offs of a glassware, and without the thermal perturbations of the resonance source material composition charge and the possibility of chemical adulteration thereof which would accompany a conventional tip-off process.

As mentioned, the metallic material of construction of the chamber body 1 should be physically stiff and non-magnetic in order to avoid influencing the behavior of the atomic resonance source material. Exemplary generally suitable metals are, for instance, AISI designation 404 Monel metal, titanium, tantalum, tungsten, stainless steel, copper and molybdenum. All of the aforementioned metals also lend themselves to conventional glass, quartz or sapphire sealing techniques.

The glass window elements of the cell construction of the invention are optically transparent and can be of any suitable composition, such as quartz, fused silica, borosilicate glass or sapphire. As suggested previously, said glass window elements need not be optically flat. For example, if desired, and as is best shown in FIG. 2, the inlet glass window element 5 can be ground or formed as an achromatic lens so as to collimate the light transmitted therethrough from the light source $L_S$, thereby to more effectively activate or excite the atomic source material residing within the chamber body 1. Similarly, the window elements of the present invention can also be formed such as to linearly or circularly polarize the light beam passing therethrough. Thus, the cell construction of the present invention provides the capability to provide glass window elements which can physically and beneficially manipulate the light passing therethrough, a capability which is not known to be enjoyed in the glass cells of the prior art.

The specific cell embodiment of the invention shown in FIGS. 1 and 2 comprises two outlet window elements 6, 6', the window element 6 being coaxial with respect to the inlet window element 5 while the window element 6' is at right angles thereto. This embodiment of the cell construction is readily adapted for use with several atomic frequency standards presently under development. In such atomic frequency standards the resonance signal is observed as a change in the light transmitted through the cell on the beam axis while fluorescence is observed as a change in the light emanating normal to the beam axis. Accordingly, in the cell embodiment of FIGS. 1 and 2, the transmitted light $L_T$ is observed through the window element 6 which is on the source light $L_S$ axis and fluorescence $L_F$ is observed through the window element 6' which is normal to said axis.

As can be noted, the cell construction of the invention offers substantive advantages over the glass cells of the prior art. The relative ease and reproducibility of accomplishing the pinch-off by cold welding at normal room temperatures and the advantages flowing therefrom have already been mentioned. The rigid metallic construction of the cell chamber is resistant to barometric changes. The relatively high thermal conductivity of the metallic chamber body offers the opportunity to homogenize internal temperature and to more quickly control said internal temperature by exterior means such as heating devices and insulation jacketing, thereby effectuating a cell having more stable and improved temperature control over that realized with the glass cells of the prior art. The cell construction also offers the possibility of utilizing integrated fibre optic interfaces through which optical activation and signal extraction can take place. Thus, the cell can be effectively thermally isolated from the heat producing electronic devices usually associated with atomic frequency standards, such as power supplies, resistors and the like, thereby further improving the temperature stability within the cell. Helium permeation, which has been noted as a problem with glass cells, is substantially reduced or avoided altogether in the cell of the invention.

Figure 3:
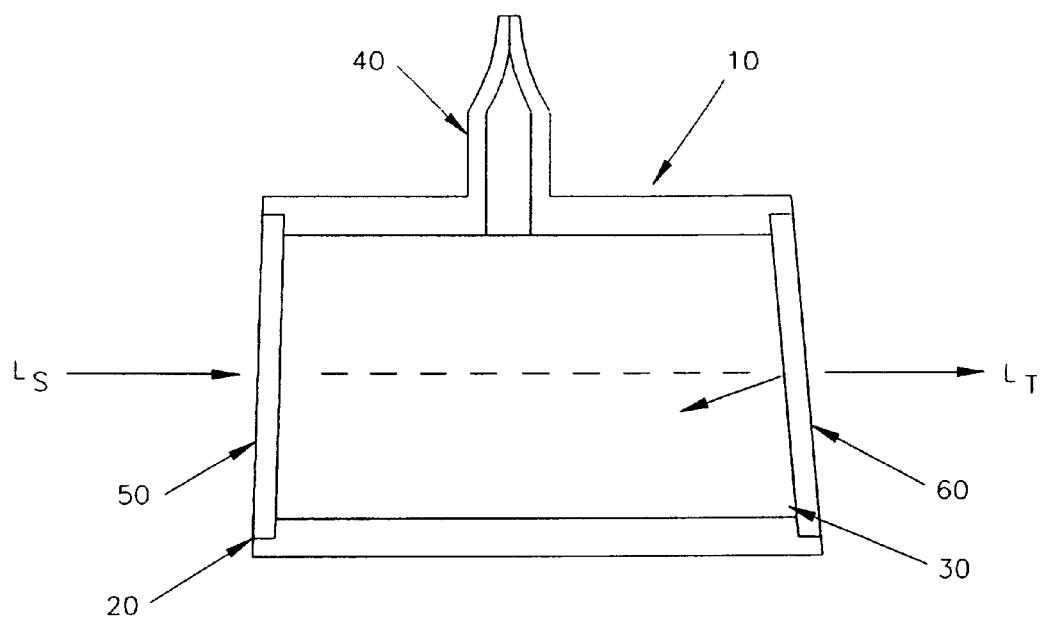
FIG. 3 is a schematic, diagrammatic, sectional side view of another embodiment of the cell construction of the invention including means to prevent light incident upon the interior of the outlet window element from reflecting back at the incident angle.
Figure 4:
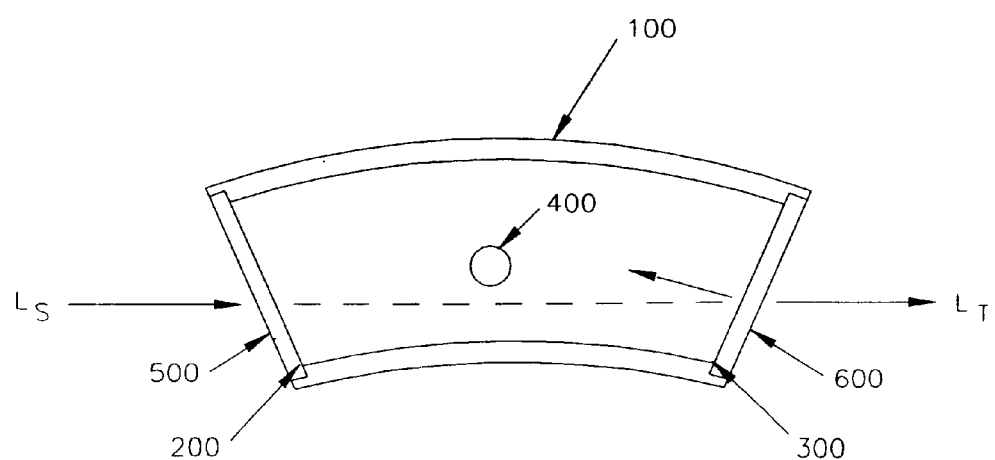
FIG. 4 is a schematic, diagrammatic, sectional side view of another embodiment of the cell construction of the invention showing an alternative means to prevent light incident upon the interior of the outlet window element from reflecting back at the incident angle.

In general, particularly where the light source employed to excite the atomic ensemble within the cell is a laser, it is desirable to prevent the source light incident upon the internal surface of the outlet window element of the cell from being reflected directly back at the incident angle toward the generating laser source. FIGS. 3 and 4 depict embodiments of the invention in which this desideratum can be achieved. Referring to FIG. 3 there is shown a cell having a straight tubular metallic chamber body 10 having an integral pinched-off tubulation 40, an inlet window aperture 20 which is oriented on a plane normal to the axis of said tubular chamber body 10 and an outlet window aperture 30 which is oriented on a plane which is not coplanar to said inlet window aperture 20. Sealed to the inlet window aperture 20 is a glass inlet window element 50. Sealed to the outlet window aperture 30 is a glass outlet window element 60. As will be noted, a light beam transmitted from a light source $L_S$ along the axis of the tubular chamber 10 strikes the interior surface of the outlet window element 60 and that portion thereof which is reflected is reflected at an angle which differs by a few degrees from the angle of incidence of the light beam thereon.

Referring to FIG. 4, the tubular metallic chamber body 100 is slightly curved along its axis. The planes of inlet window aperture 200 and outlet window aperture 300 lie on separate spaced apart radii of curvature of said chamber 100. Sealed to the inlet window aperture 200 is a glass inlet window element 500. Sealed to the outlet window aperture 300 is a glass outlet window element 600. The light beam emanating from light source $L_S$ traverses the curved length of the chamber body 100, strikes the interior surface of the outlet window element 600 and that portion thereof which is reflected, is reflected at an angle which differs by a few degrees from the angle of incidence of the light beam thereon.

This disclosure reveals various preferred embodiments of the invention. However, variations in the form, construction and arrangement of components and the modified application of the invention are possible without departing from the scope of the invention as claimed.

What is claimed is:

1. A cell for optically activated atomic frequency standards comprising: a chamber body composed of a stiff, non-magnetic metal, said chamber body having an inlet window aperture, a first outlet window aperture coaxial with respect to said inlet window aperture, a second outlet window aperture normal to said inlet window aperture and, integrally attached thereto and communicating with the interior of said body, a cold weldable metallic pinch-off tubulation; a glass inlet window element sealed to said inlet window aperture and a glass outlet window element sealed to each said outlet window aperture.

2. The cell of claim 1 wherein at least one of said window elements is a lens to optically modify light transmitted therethrough.

3. The cell of claim 2 wherein said inlet window element is an achromatic lens to collimate light transmitted therethrough.

4. The cell of claim 2 wherein said inlet window element is a polarizing lens.

5. The cell of claim 1 including means to prevent light impinging on the interior surface of each said outlet window at an angle of incidence from reflecting back at said angle of incidence.

6. The cell of claim 5 wherein said means comprises a metallic chamber body conformed as a straight tube having a longitudinal axis, said chamber body having an inlet window aperture lying in a plane normal to said axis and said first outlet window aperture lying in a plane which is at an angle to the plane of said inlet window aperture.

7. The cell of claim 5 wherein said metallic chamber body is conformed as a curved tube having two ends, said chamber body having said inlet window aperture lying in a plane normal to one end of said curved tube and said first outlet window aperture lying in a plane normal to the other end of said tube.

8. The cell of claim 1 wherein said metallic chamber body is composed of a metal selected from the group consisting of: 404 Monel metal, titanium, tantalum, tungsten, stainless steel, copper and molybdenum.

9. The cell of claim 1 wherein said tubulation is pinched off and said cell contains therein an atomic source composition comprising a mixture of an alkali metal and at least one buffer gas.

10. The cell of claim 9 wherein said alkali metal is rubidium.

11. The cell of claim 9 wherein said alkali metal is cesium.

* * * * *